US010636684B2

(12) United States Patent
Basu et al.

(10) Patent No.: US 10,636,684 B2
(45) Date of Patent: Apr. 28, 2020

(54) LOADLOCK INTEGRATED BEVEL ETCHER SYSTEM

(71) Applicant: Applied Materials, Inc., Santa Clara, CA (US)

(72) Inventors: Saptarshi Basu, San Jose, CA (US); Jeongmin Lee, San Ramon, CA (US); Paul Connors, San Mateo, CA (US); Dale R. Du Bois, Los Gatos, CA (US); Prashant Kumar Kulshreshtha, San Jose, CA (US); Karthik Thimmavajjula Narasimha, San Francisco, CA (US); Brett Berens, San Jose, CA (US); Kalyanjit Ghosh, Pleasanton, CA (US); Jianhua Zhou, Campbell, CA (US); Ganesh Balasubramanian, Fremont, CA (US); Kwangduk Douglas Lee, Redwood City, CA (US); Juan Carlos Rocha-Alvarez, San Carlos, CA (US); Hiroyuki Ogiso, Sunnyvale, CA (US); Liliya Krivulina, Santa Clara, CA (US); Rick Gilbert, San Jose, CA (US); Mohsin Waqar, Alameda, CA (US); Venkatanarayana Shankaramurthy, San Jose, CA (US); Hari K. Ponnekanti, San Jose, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 16/540,304

(22) Filed: Aug. 14, 2019

(65) Prior Publication Data

US 2019/0371630 A1 Dec. 5, 2019

Related U.S. Application Data

(62) Division of application No. 15/013,547, filed on Feb. 2, 2016, now Pat. No. 10,403,515.

(Continued)

(51) Int. Cl.
*C23C 16/40* (2006.01)
*H01L 21/67* (2006.01)

(Continued)

(52) U.S. Cl.
CPC .. *H01L 21/67069* (2013.01); *H01J 37/32009* (2013.01); *H01J 37/3244* (2013.01);

(Continued)

(58) Field of Classification Search
CPC .......... H01L 21/67069; H01L 21/6708; H01L 21/68785; H01L 21/67201;

(Continued)

(56) References Cited

U.S. PATENT DOCUMENTS 4,590,042 A * 5/1986 Drage ................ H01J 37/3244 156/345.34
5,009,738 A * 4/1991 Gruenwald ......... H01J 37/3244 156/345.47

(Continued)

FOREIGN PATENT DOCUMENTS

JP 07201829 8/1995
KR 1020070120884 12/2007

OTHER PUBLICATIONS

International Seach Report and Written Opinion for International Application No. PCT/US2016/043883 dated Oct. 27, 2016.

(Continued)

*Primary Examiner* — Rudy Zervigon
(74) *Attorney, Agent, or Firm* — Patterson + Sheridan LLP

(57) ABSTRACT

Implementations disclosed herein describe a bevel etch apparatus within a loadlock bevel etch chamber and methods 300 328 338 334 324 320 326 322 332 308 312 348 341 336 343 340 342 344 346 302 304 306 330 350 314 of using the same. The bevel etch apparatus has a mask assembly within the loadlock bevel etch chamber. During an etch process, the mask assembly delivers a gas flow to control bevel etch without the use of a shadow frame. As such, the edge exclusion at the bevel edge can be reduced, thus increasing product yield.

20 Claims, 6 Drawing Sheets

Related U.S. Application Data

(60) Provisional application No. 62/232,163, filed on Sep. 24, 2015.

(51) Int. Cl.
*H01J 37/32* (2006.01)
*H01L 21/687* (2006.01)

(52) U.S. Cl.
CPC .. *H01J 37/32357* (2013.01); *H01J 37/32366* (2013.01); *H01J 37/32633* (2013.01); *H01J 37/32715* (2013.01); *H01L 21/6708* (2013.01); *H01L 21/67201* (2013.01); *H01L 21/68785* (2013.01); *H01J 2237/334* (2013.01)

(58) Field of Classification Search
CPC ........... H01J 37/32009; H01J 37/32366; H01J 37/32357; H01J 37/32633; H01J 37/32715; H01J 37/3244; H01J 2237/334; C23C 14/24; C23C 14/243; C23C 14/56; C23C 14/562; C23C 14/568; C23C 16/4485; C23C 16/45548; C23C 16/45551; C23C 16/54; C23C 16/545
USPC ................... 118/715, 719, 723 ER, 723 MR; 156/345.35, 345.36, 345.31, 345.32
See application file for complete search history.

(56) References Cited

U.S. PATENT DOCUMENTS 5,223,001 A * 6/1993 Saeki .................... C23C 14/566 118/719
5,314,574 A * 5/1994 Takahashi ......... H01L 21/02049 118/719
5,366,557 A * 11/1994 Yu ..................... H01L 21/02164 118/715
5,532,190 A * 7/1996 Goodyear ......... C23C 16/45512 118/715
6,117,349 A 9/2000 Huang et al.
6,178,660 B1 * 1/2001 Emmi ............... H01L 21/67017 34/216
6,499,425 B1 * 12/2002 Sandhu ................... C23C 16/34 118/723 E
6,592,771 B1 * 7/2003 Yamanaka .......... H01L 21/3065 216/63
6,821,180 B2 * 11/2004 Kimura ................... H01J 9/027 445/5
6,849,241 B2 * 2/2005 Dauelsberg ....... C23C 16/45514 117/102
6,852,167 B2 * 2/2005 Ahn .................. C23C 16/45525 118/715
7,033,921 B2 * 4/2006 Jurgensen ............... C30B 25/02 438/478
7,201,942 B2 * 4/2007 Jurgensen ........... C23C 14/0015 118/724
7,294,207 B2 * 11/2007 Strauch ............. C23C 16/45508 118/715
7,534,362 B2 * 5/2009 Savas ................ H01J 37/32082 216/58
7,572,337 B2 * 8/2009 Rocha-Alvarez ........................... C23C 16/4405 118/715
7,670,432 B2 * 3/2010 Li ....................... C23C 16/4412 118/715
7,699,932 B2 * 4/2010 Miller ............... C23C 16/45544 118/715
7,794,546 B2 * 9/2010 Li ....................... C23C 16/4409 118/719
7,850,779 B2 * 12/2010 Ma .......................... C23C 16/18 118/715
7,918,938 B2 * 4/2011 Provencher ....... C23C 16/45536 118/715
7,993,457 B1 * 8/2011 Krotov ............. C23C 16/45544 118/719
8,100,081 B1 * 1/2012 Henri ........................ C23F 4/00 118/723 ER
8,197,636 B2 * 6/2012 Shah ................. H01J 37/32366 118/719
8,236,106 B2 * 8/2012 Iizuka ................. C23C 16/4412 118/50
8,282,735 B2 * 10/2012 Choi ................. C23C 16/45504 118/715
8,568,554 B2 * 10/2013 Hayashi .............. H01J 37/3244 118/715
8,715,455 B2 * 5/2014 Brcka ............... H01J 37/32357 118/715
8,815,014 B2 * 8/2014 Faguet ................ C23C 16/4401 118/719
9,388,494 B2 * 7/2016 Xia ..................... C23C 16/4401
9,394,615 B2 * 7/2016 Sun ........................... C23F 1/08
9,399,228 B2 * 7/2016 Breiling .................. B05B 1/005
9,449,795 B2 * 9/2016 Sabri ..................... C23C 16/505
9,548,188 B2 * 1/2017 Hausmann ........ H01J 37/32449
9,719,169 B2 * 8/2017 Mohn ................... C23C 16/401
9,758,868 B1 * 9/2017 Breiling .............. C23C 16/4408
9,816,183 B2 * 11/2017 Ashihara ........... C23C 16/45565
2001/0009814 A1 7/2001 Rolfson
2002/0039625 A1 * 4/2002 Powell .................. C23C 16/452 427/569
2003/0177977 A1 * 9/2003 Strauch ............ C23C 16/45508 117/84
2003/0207032 A1 * 11/2003 Ahn .................... C23C 16/4412 427/255.34
2003/0207033 A1 * 11/2003 Yim .................. C23C 16/45565 427/255.37
2005/0000441 A1 * 1/2005 Kaeppeler ......... C23C 16/45568 118/723 E
2005/0263248 A1 * 12/2005 Rocha-Alvarez ........................... C23C 16/4405 156/345.34
2005/0268856 A1 * 12/2005 Miller ............... C23C 16/45519 118/729
2005/0269030 A1 * 12/2005 Kent ................ H01L 21/67178 156/345.31
2006/0196420 A1 * 9/2006 Ushakov ........... C23C 16/45563 118/715
2006/0213439 A1 * 9/2006 Ishizaka .............. C23C 16/4401 118/715
2007/0116872 A1 * 5/2007 Li ........................... C23C 16/12 427/248.1
2007/0116873 A1 * 5/2007 Li ....................... C23C 16/4401 427/248.1
2007/0116888 A1 * 5/2007 Faguet .............. C23C 16/45525 427/569
2007/0157683 A1 * 7/2007 Li ....................... C23C 16/4401 70/209
2007/0158305 A1 * 7/2007 Cooke ............... H01J 37/32623 216/67
2007/0209588 A1 * 9/2007 Li ....................... C23C 16/4412 118/715
2007/0209590 A1 * 9/2007 Li ....................... C23C 16/4401 118/719
2007/0212484 A1 * 9/2007 Li ....................... C23C 16/4412 427/248.1

(56) References Cited

U.S. PATENT DOCUMENTS

2008/0185104 A1* 8/2008 Brcka .............. H01J 37/32357 156/345.29
2010/0288728 A1* 11/2010 Han ....................... H01J 37/20 216/41
2011/0135842 A1* 6/2011 Faguet ............... C23C 16/4401 427/569
2011/0209663 A1* 9/2011 Endo .................. C23C 16/4412 118/719
2012/0161405 A1* 6/2012 Mohn .................. C23C 16/401 279/142
2013/0344245 A1* 12/2013 Xia .................... C23C 16/4401 427/255.7
2014/0170857 A1* 6/2014 Lang .................. H01L 21/6708 438/749
2014/0217193 A1* 8/2014 Breiling ................. B05B 1/005 239/1
2015/0004806 A1* 1/2015 Ndiege ............ H01L 21/02164 438/789
2015/0118863 A1* 4/2015 Rathod ............ H01L 21/02164 438/778

OTHER PUBLICATIONS

Taiwan Office Action dated Dec. 13, 2018 for Application No. 105126061.

* cited by examiner

LOADLOCK INTEGRATED BEVEL ETCHER SYSTEM

CROSS-REFERENCE TO RELATED APPLICATIONS

This application is a divisional of co-pending U.S. patent application Ser. No. 15/013,547, filed Feb. 2, 2016, which priority to U.S. Provisional Patent Application Ser. No. 62/232,163, filed Sep. 24, 2015, both are hereby incorporated herein by reference.

BACKGROUND

Field

Implementations of the present disclosure generally relate to apparatus for etching of substrates during semiconductor manufacturing.

Description of the Related Art

Chip manufacturers strive for high device yield, low defect count, and increased performance from every wafer processed for increased efficiency. Device yield per wafer can be increased by maximizing patterned area on each substrate while maintaining or reducing defect count.

The bevel edge of the wafer needs to be cleaned to avoid bevel peeling and reduce defect count and further contamination of the wafer in the lithography tool. The area near the bevel edge where no deposition is desired to avoid bevel peeling is termed "edge-exclusion". The deposition region within the edge exclusion is ideally a film with uniform thickness over the wafer surface. However, due to plasma behavior at the bevel edge of the wafer for some deposition materials such as amorphous carbon, the film can be thicker at the edge resulting in an "edge-hump".

The current approach is to use a shadow ring to cover the edge of the wafer to reduce the thickness of the edge-hump and to keep the bevel clean. The limitation of this approach is that the edge exclusion zone extends to 3.5 mm and is detrimental to device yield. The edge profile is also not easily customizable as it is dependent on the size and shape of the shadow ring. The current shadow ring based approach has had only limited success creating bevel edge exclusion lengths of less than 3.5 mm.

FIG. 1A (Prior Art) is a partial cross-sectional view showing an ideal profile for a deposition layer 102 formed on a substrate 101. The deposition layer 102 is uniformly deposited across a top surface of the substrate 101 and there is no deposition within an edge exclusion area 103. However, an actual deposition profile generally differs from the ideal configuration illustrated in FIG. 1A. FIG. 1B (Prior Art) is a partial cross-sectional view showing an actual surface profile of a deposition layer 102*a* on the substrate 101 after having undergone a CVD or PECVD deposition. The deposition layer 102*a* is deposited without the use of a shadow frame or other edge deposition control. Shown here, the deposition layer 102*a* extends to the edge exclusion area 103. A bevel edge 104 with extra thickness may be formed near the edge exclusion area 103.

To prevent the formation of the deposition film at the edge of the substrate, FIG. 1C (Prior Art) is a partial cross-sectional view showing one conventional approach that proposes to use a shadow ring 105. The shadow ring 105 is usually arranged at a location that overlaps and covers at least one portion of the edge exclusion area 103 of the substrate 101. As a result, as shown in FIG. 1C, a deposition layer 102*b* gradually reduces under the shadow of the shadow ring 105. The gradual reduction of the deposition layer 102*b* leaves non-level deposition product over edge exclusion area 103 and a portion of the preceding area of the deposition layer 102*b*.

Therefore, there is a need for devices and methods for further reducing bevel edge exclusion.

SUMMARY

Implementations disclosed herein include systems and methods of reducing bevel edge exclusion. The systems and methods herein use a centered mask with a gas flow between the centered mask and the surface of the substrate. Etchants are delivered from a second source such that the edge exclusion area of the substrate can be etched while minimizing etching on the substrate under the center mask.

In one implementation, a loadlock bevel etch chamber can include a substrate support having a substrate support surface positioned in a processing region; a remote plasma source configured to supply an etching agent to a peripheral region of the substrate support surface; and a masking assembly coupled to a gas source, the masking assembly including a masking plate; a mask shaft connected with the masking plate; a multidirectional movement device in connection with the mask shaft, the multidirectional movement device being able to adjust the position of mask by moving the mask shaft; and a gas channel formed in the masking plate, the gas channel and the masking plate being configured to deliver a gas flow over the substrate support surface, the gas flowing from an approximately central region of the substrate support surface toward the peripheral region of the substrate support surface.

In another implementation, a loadlock bevel etch chamber can include a substrate support having a substrate support surface positioned in a processing region; a remote plasma source configured to supply an etching agent to a peripheral region of the substrate support surface; and a masking assembly coupled to a gas source, the masking assembly including a masking plate; an extension connected with the masking plate; a baffle connected with the extension, the baffle having a plurality of slots formed therethrough, the remote plasma source being delivered to the processing region through the baffle; a movement control device in connection with the baffle, the movement control device configured to move the baffle and the mask simultaneously; and a gas channel formed in the masking plate, the gas channel and the masking plate being configured to deliver a gas flow over the substrate support surface, the gas flowing from an approximately central region of the substrate support surface toward the peripheral region of the substrate support surface.

In another implementation, a loadlock bevel etch chamber can include a substrate support having a substrate support surface positioned in a processing region; a remote plasma source configured to supply an etching agent to a peripheral region of the substrate support surface; and a masking assembly coupled to a gas source, wherein the masking assembly is configured to deliver a gas flow over the substrate support surface, the high velocitygas flowing from an approximately central region of the substrate support surface toward the peripheral region of the substrate support surface.

BRIEF DESCRIPTION OF THE DRAWINGS

So that the manner in which the above recited features of the present disclosure can be understood in detail, a more particular description of the disclosure, briefly summarized above, may be had by reference to implementations, some of which are illustrated in the appended drawings. It is to be noted, however, that the appended drawings illustrate only typical implementations of this disclosure and are therefore not to be considered limiting of its scope, for the disclosure may admit to other equally effective implementations.

To facilitate understanding, identical reference numerals have been used, wherever possible, to designate identical elements that are common to the Figures. Additionally, elements of one implementation may be advantageously adapted for utilization in other implementation described herein.

DETAILED DESCRIPTION

Implementations disclosed herein describe a bevel etch apparatus located in loadlock bevel etch chamber. The bevel etch system is placed in a process capable loadlock bevel etch chamber and thus does not replace a process chamber and reduce throughput of the deposition tool. The bevel etch apparatus uses a Remote Plasma Source (RPS) to produce oxygen-argon plasma to rapidly etch the bevel edge region of the wafer uniformly along the circumference of the wafer. The etch gas is a mixture of Oxygen, Argon, and Nitrogen that is uniformly distributed using a showerhead kind of apparatus. A secondary Argon gas flow is used as the purge gas to control the etch profile and prevent radial diffusion of the etch reactants. During substrate processing, the purge gas flows through a narrow gap between the substrate and the mask.

The bevel etch apparatus provides customized bevel thickness profiles to meet different customer specifications. The system described herein can clear the bevel between 0.2 mm and 1.0 mm from the bevel edge. Further, the system can reach between 5% and 30% of the full thickness of a deposited layer at a range of 1 mm to 2.5 mm through a material removal process. The material removal process of the bevel etch apparatus in the loadlock bevel etch chamber is different from the exclusion approach of the shadow ring. The bevel etch apparatus provides a dual gas flow to create a controlled material removal from the bevel while protecting the central region of the substrate with the mask.

The system described in this document integrates a bevel etch system into a process capable loadlock chamber of the PECVD tool (referred to hereinafter as a “bevel etch apparatus” that can be placed in a loadlock chamber), described hereafter as a loadlock bevel etch chamber. The bevel etch apparatus provides significant cost benefits, reduces need of peripheral systems, saves fab footprint, and etches a bevel edge without breaking vacuum. Further, the bevel etch apparatus brings all the benefits of bevel etching (including controllable etch profile, higher yield, and lesser contamination) packaged within the loadlock bevel etch chamber in a cost effective manner. The following sections describes various hardware features pertaining to system, design, and packaging of the hardware in the loadlock, and various chemistry and process conditions used with implementations descried herein. Elements of the implementations disclosed herein are more clearly described with relation to the figures described below.

Figure 1A:
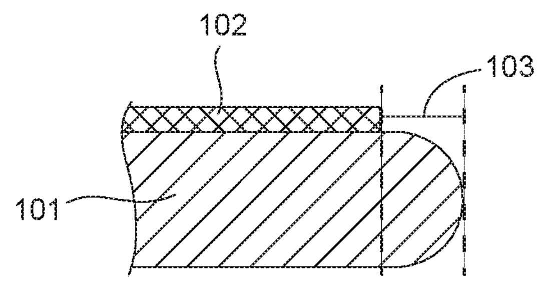
FIG. 1A (Prior Art) illustrates a desired profile for a deposition layer at a peripheral region of a substrate.
Figure 1B:
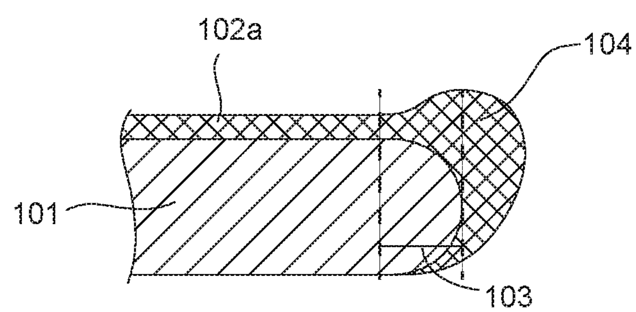
FIG. 1B (Prior Art) illustrates a profile actually obtained for a deposition layer at a peripheral region of a substrate.
Figure 1C:
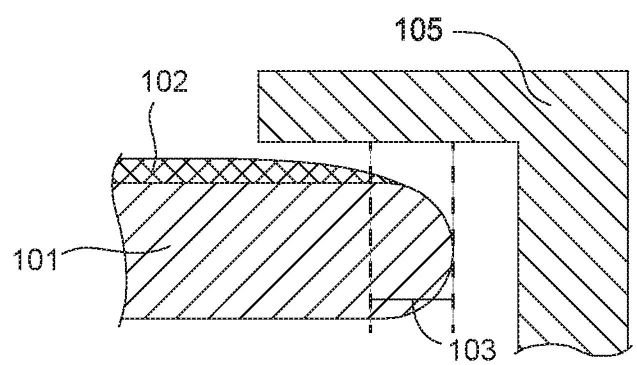
FIG. 1C (Prior Art) illustrates one conventional approach using a shadow ring to prevent the formation of a deposition film at the peripheral region of the substrate.
Figure 2A:
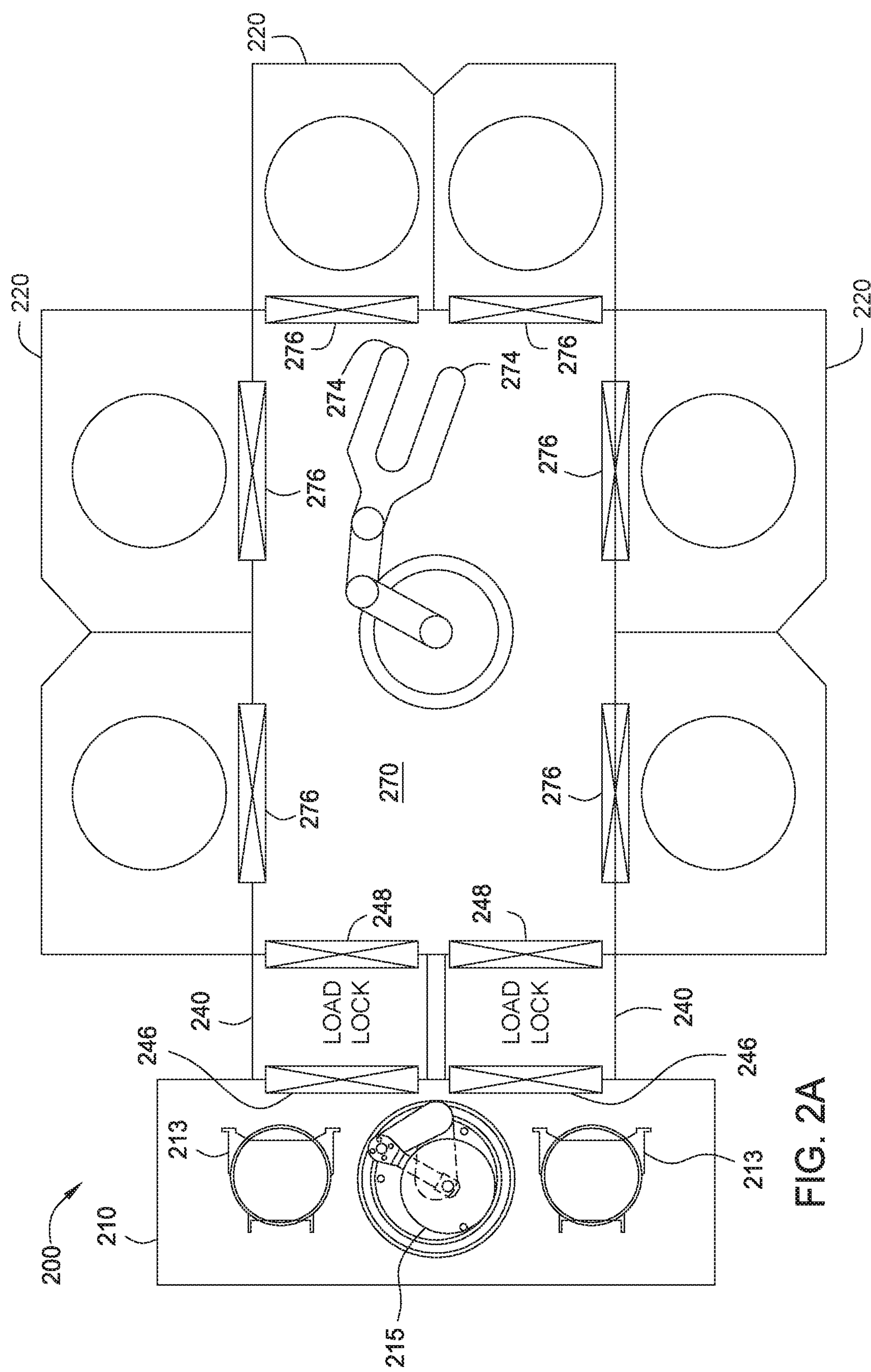
FIG. 2A depicts a top view of a processing system, according to implementations described herein.

FIG. 2A is a schematic view showing an implementation of a substrate processing system 200. The processing system 200 comprises a factory interface 210 where substrates are loaded into and unloaded from loadlock bevel etch chambers 240, a substrate transfer chamber 270 housing a robot 272 for handling substrates, and a plurality of twin process chambers 220 connected to the transfer chamber 270. The processing system 200 is adapted to accommodate various processes and supporting chamber hardware such as CVD and etch processes.

As shown in FIG. 2A, the factory interface 210 may include substrate cassettes 213 and a substrate-handling robot 215. Each of the cassettes 213 contains substrates ready for processing. The substrate-handling robot 215 may comprise a substrate mapping system to index the substrates in each cassette 213 in preparation for loading the substrates into the loadlock bevel etch chambers 240. Each loadlock bevel etch chamber 240 provides a vacuum interface between the factory interface 210 and the transfer chamber 270. In implementations described herein, at least one of the loadlock bevel etch chambers 240 has a bevel etch apparatus contained within the loadlock bevel etch chamber.

Figure 2B:
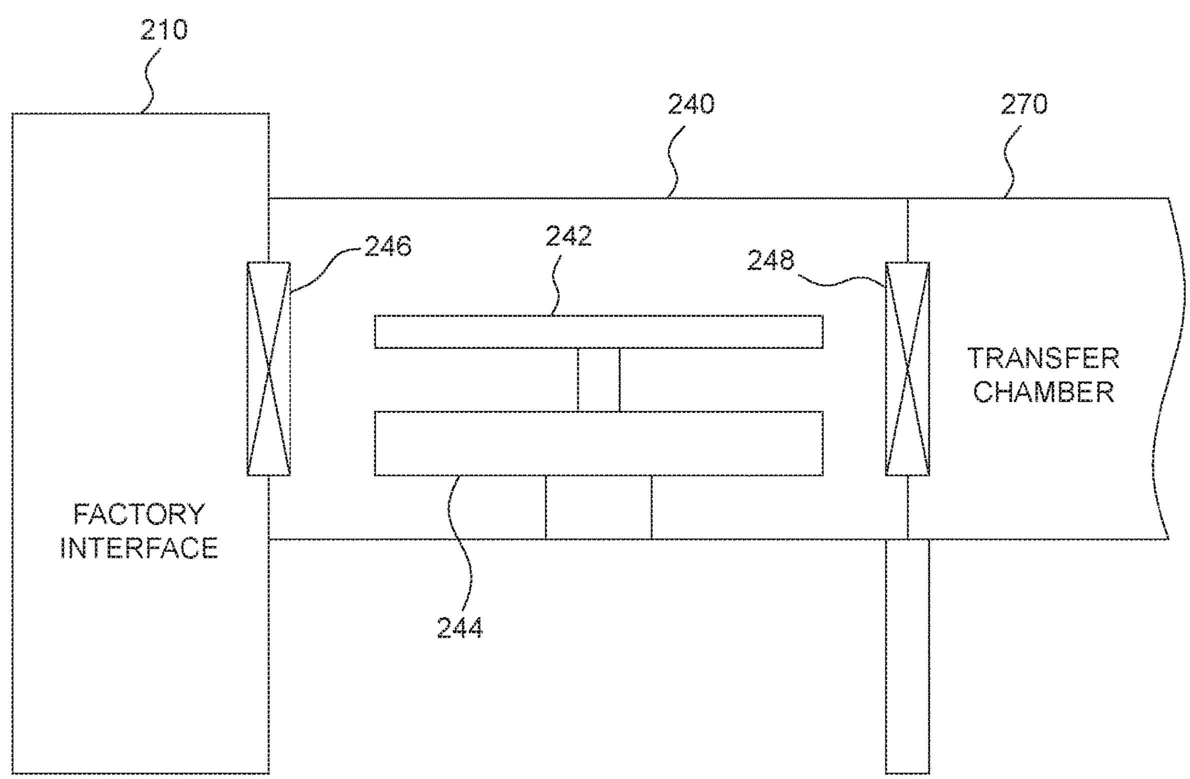
FIG. 2B depicts a side view of a loadlock bevel etch chamber as part of a processing system, according to implementations described herein.

FIG. 2B is a side view of a loadlock bevel etch chamber 240 as connected with the processing system 200, according to implementations described herein. As shown in FIG. 2B, each loadlock bevel etch chamber 240 may comprise an upper substrate support 242, a lower substrate support 244 or both. In implementations including the upper substrate support 242 and the lower substrate support 244, the supports are stacked within the loadlock bevel etch chamber 240. The upper substrate support 242 and the lower substrate support 244 may be configured to support incoming and outgoing substrates thereon. Substrates may be transferred between the factory interface 210 and each loadlock bevel etch chamber 240 via one slit valve 246, and between each loadlock bevel etch chamber 240 and the transfer chamber 270 via one slit valve 248. The upper substrate support 242 and lower substrate support 244 may comprise features for temperature control, such as built-in heater or cooler to heat or cool substrates during transferring. The bevel etch apparatus is described in more detail with reference to FIG. 3A and 3B below. However, it is understood that components described here can be incorporated with other implementations described herein without further recitation.

Referring to FIG. 2A again, the transfer chamber 270 includes a substrate-handling robot 272 operable to transfer substrates between the loadlock bevel etch chambers 240 and the twin process chambers 220. More specifically, the substrate-handling robot 272 may have dual substrate-handling blades 274 suitable to transfer two substrates at the same time from one chamber to another. Substrates may be transferred between the transfer chamber 270 and the twin process chambers 220 via slit valves 276. The movement of the substrate-handling robot 272 may be controlled by a motor drive system (not shown), which may include a servo or stepper motor.

Figure 3:
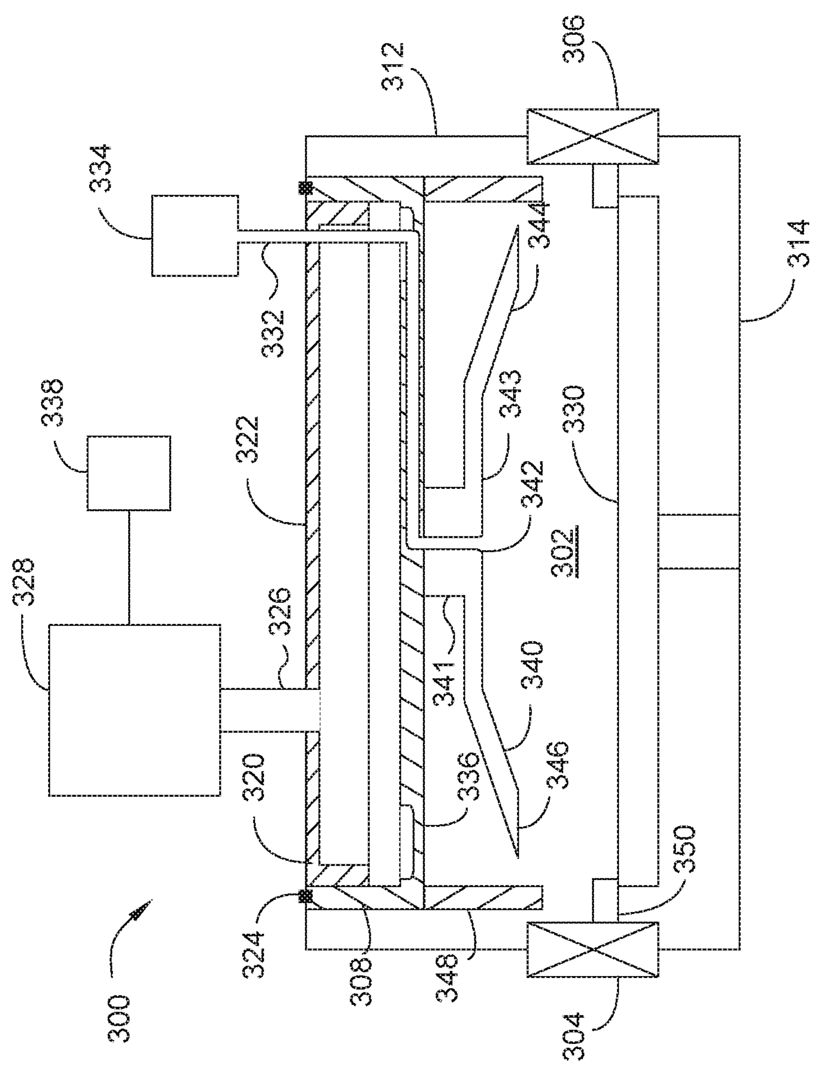
FIG. 3 depicts a side view of a loadlock bevel etch chamber, according to implementations described herein.

FIG. 3 depicts a side view of a bevel etch apparatus in a loadlock bevel etch chamber 300, according to implementations described herein. The loadlock bevel etch chamber 300 is connected to the transfer chamber and includes a processing region 302 with a substrate support 330 in which individual substrates can undergo a bevel edge etching process. Each processing region 302 has walls 312 and a bottom 314 that partially define the processing region 302. The processing region 302 may be accessed through an entrance port 304 and an exit port 306 formed in the walls 312 that facilitate movement of the substrate into and out of each processing region 302. The walls 312 and bottom 314 may be fabricated from a unitary block of aluminum or other material compatible with processing. The walls 312 support a top portion 322, which is connected with a baffle 308. The processing region 302 may be evacuated uniformly by a vacuum pump (not shown).

The substrate support 330 may be centrally disposed within each processing region 302. In one implementation, the substrate support 330 may be temperature controlled. The substrate support 330 may support a substrate 404 during processing, shown with reference to FIGS. 4A and 4B. In one implementation, the substrate support 330 comprises at least one embedded heater, operable to controllably heat the substrate support 330 and the substrate 404 positioned thereon to a predetermined temperature. In one implementation, the substrate support 330 may operate to maintain the substrate 404 at a temperature between about 150 degrees Celsius to about 1000 degrees Celsius, depending on the processing parameters for the material being processed.

The top portion 322 of the loadlock bevel etch chamber 300 provides an upper boundary to the processing region 302. The top portion 322 may be removed or opened to service the processing region 302. In one implementation, the top portion 322 may be fabricated from aluminum. The baffle 308 is movably connected with the top portion 322 through one or more movement control devices 324. Movement control devices 324 are devices which can be used to adjust the position of one or more chamber components, such as the baffle 308. In one implementation, the movement control device 324 can be a motor or an actuator.

In one implementation, the top portion 322 is a machined aluminum block with cooling elements formed therein, such as cooling channels. The top portion 322 can dissipate process heat as well as distribute the gas to the loadlock bevel etch chamber 300. Movement control devices 324, such as pneumatic actuators and springs, being positioned on the surface of the top portion 322 can then move the baffle 308. The cover plate 320 protects the bottom surface of the top portion 322 from the radicals produced and delivered from the remote plasma source 328. Thus, the cover plate 320 reduces radical recombination and improves etch rate. The edge of the cover plate 320 forms a L-shaped ridge which acts in combination with an L-shaped formation on the baffle 308 to reduce parasitic leakage.

In another implementation, the baffle 308 is machined from a quartz block. The baffle 308 can be the primary moving component in the loadlock bevel etch chamber 300. The baffle 308 moves to allow substrate entry and exit. The baffle 308 can have between 6 and 36 machined slots 336 to facilitate uniform distribution of the radicals. The baffle 308 uses standoffs 348 to make contact with a ceramic chuck ring 350. This combination of standoff 348 and chuck ring 350 provides a parallel and uniform gap between the mask 340 and the substrate. The height of the baffle 308 determines the conductance of the gases at the substrate edge. The standoff 348 is generally rectangular and minimizes the effect on the gas flow. The standoffs 348 may include holes to prevent stagnation zones.

The baffle 308 has a gas distribution circuit 332 formed or positioned therein. The gas distribution circuit 332 is connected with a gas source 334, such as inert gas source. Further, the baffle 308 has a plurality of slits 336 formed therein. The slits 336 may be sized such that a cover plate (not shown) may be positioned therein. The slits 336 may be formed in a ring around the upper portion of the baffle 308. The slits 336 may partially or completely penetrate through the lower portion of the baffle 308.

The baffle 308 is positioned around and partially sealed with a cover plate 320, the cover plate 320 being connected to the top portion 322. The cover plate 320 has one or more openings, such that a shaft 326 can be fluidly connected with the region between the cover plate 320 and the baffle 308. The shaft 326 is connected with a remote plasma source 328.

To etch a portion of a deposition film at an edge region of one substrate 404, the processing region 302 includes a remote plasma source 328 that is disposed adjacent to the top portion 322. The remote plasma source 328 includes a power source and one or more gas sources, such that a plasma can be generated remotely.

The baffle 308 is connected with a mask 340. The mask 340 may be composed of quartz, aluminum, ceramic, or another material which is capable of withstanding the etching gases. Further, the mask 340 can be coated with nickel or other materials capable of reducing radical recombination on the mask 340. The mask 340 has an extension 341, a masking plate 343, an angled ledge 344, and a flow surface 346. The mask 340 and further related components described herein may also be referred to as a mask assembly. The extension 341 extends from the masking plate 343 and connects the masking plate 343 with the surface of the baffle 308. The extension 341 may be part of a unitary body with the masking plate 343. The masking plate 343 has a gas port 342 formed therein. The gas port 342 is shown as a single, centrally positioned port. However, a plurality of ports may be used for the gas port 342 in one or more implementations. Further, the gas port 342 may be positioned at any location which allows gas to be delivered through the masking plate 343 and toward the substrate position on the substrate support 330.

In one implementation, the mask 340 is attached to the baffle 308 using three screws. The extension 341 is a ceramic and acts as a spacer between the mask and the baffle. The thickness of the extension 341 can be varied to change the substrate-mask gap. The mask 340 has a diameter which can be between 290 mm and 305 mm for a 300 mm diameter substrate. In one implementation, the mask radius is 149.5 mm. The shape and dimension of the mask 340 are related to the dimensions of the substrate and may be of different sizes and shapes to match the general shape of the substrate.

The angled ledge 344 extends outward from the masking plate 343. The angle of the angled ledge 344 determines the amount of space in the region between the substrate 404 and the masking plate 343. The angled ledge 344 is shown as ring shape formed into the masking plate, and having an angle of between 5 degrees and 60 degrees, such as angled ledge of about 15 degrees. The angled ledge 344 can have one or more angles formed therein. The flow surface 346 is formed at the exposed edge of the angled ledge 344. The flow surface 346 is shown here as a largely horizontal surface, formed at the end of the angled ledge 344.

The bevel edge etching may be used to remove undesirable portions of a deposition film in the edge region of the substrate 404. When edge etching, the remote plasma source 328 receives an etching gas from the first gas source 338. Examples of etching gases may include, without limitation, $NF_3$, $O_2$, $F_2$, $N_2$, $H_2O$, $Cl_2$, $NH_3$, $H_2$, or $SF_6$. RF power can then be applied to an electrode in the remote plasma source 328 to excite the etching gas. An etching agent in a plasma phase is formed in the remote plasma source 328. The etching agent is then delivered through the shaft 326 and to the baffle 308.

To prevent the diffusion of the etching agent toward the central region of the substrate 404, the second gas source 334 provides an inert gas that is delivered via the gas distribution circuit 332, and creates a high velocity flow on the top surface of the substrate 404 from its central region toward the flow surface 446 of the mask 340. The high velocity flow of the inert gas limits the action area of the etching agent to areas of the substrate 404 which are beyond the flow surface 346. While one specific implementation of the bevel etch loadlock bevel etch chamber 300 has been illustrated above, variant implementations may be possible.

As has been described above, the bevel etch apparatus in the loadlock bevel etch chamber 300 is thus able to integrate substrate edge processing capabilities to process multiple substrates concurrently. While each bevel etch apparatus of the processing system shown in FIG. 3 has been described as including the baffle 308 and mask 340 combination for edge etching capabilities, other loadlock bevel etch chambers may integrate diverse combinations of masking in which the edge processing function may be implemented. A further example of a substrate processing system with loadlock bevel etch chambers implementing the edge processing function are described hereafter in conjunction with FIGS. 4A and 4B.

Figure 4A:
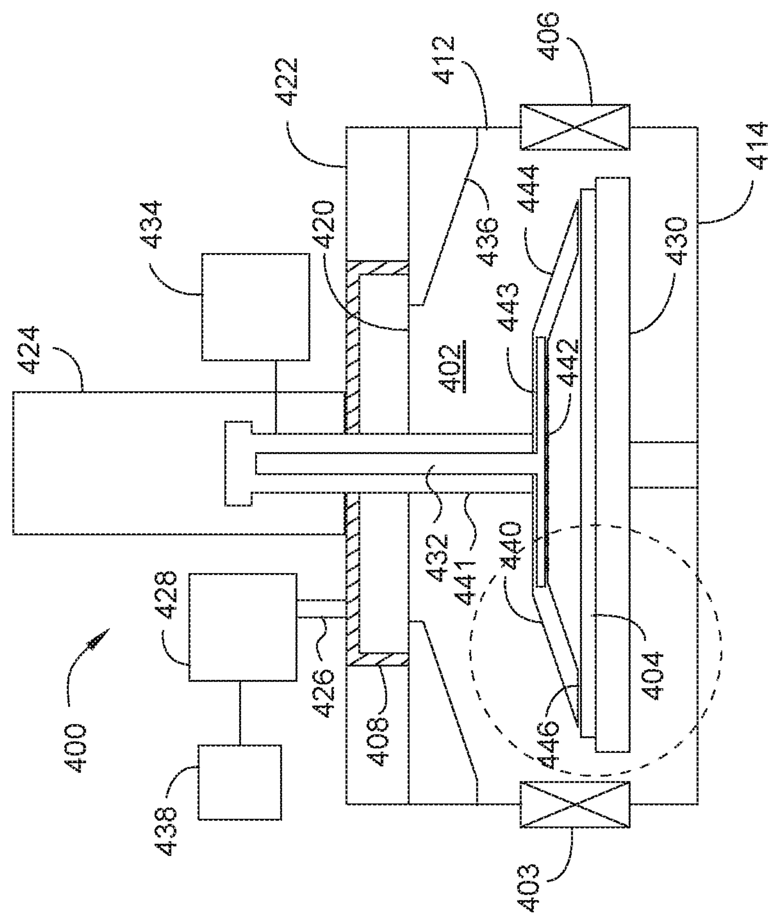
FIG. 4A depicts a side view of a loadlock bevel etch chamber, according to further implementations described herein.

FIG. 4A depicts a side view of a bevel etch apparatus in loadlock bevel etch chamber 400, according to further implementations described herein. The loadlock bevel etch chamber 400 is connected to the transfer chamber and includes a processing region 402 with a substrate support 430 in which individual substrates can undergo a bevel edge etching process. Each processing region 402 has walls 412 and a bottom 414 that partially define the processing region 402. The processing region 402 may be accessed through an entrance port 403 and an exit port 406 formed in the walls 412 that facilitate movement of the substrate into and out of each processing region 402. The walls 412 and bottom 414 may be fabricated from a unitary block of aluminum or other material compatible with processing. The walls 412 support a top portion 422, which is connected with a manifold 408. The processing region 402 may be evacuated uniformly by a vacuum pump (not shown).

The substrate support 430 may be centrally disposed within each processing region 402. The substrate support 430 may be substantially similar to the substrate support 330 described with reference to FIG. 3. In one implementation, the substrate support 430 comprises at least one embedded heater, operable to controllably heat the substrate support 430 and the substrate 404 positioned thereon to a predetermined temperature. The substrate support 430 can be composed of aluminum, ceramic, or other materials.

The substrate support 430 may support a substrate 404 during processing. The substrate 404 may be made from a composition used in semiconductor devices, such as silicon. Further, the substrate 404 may be a wafer having a 300 mm diameter, a 450 mm diameter or others.

The top portion 422 provides an upper boundary to the processing region 402. The top portion 422 may be removed or opened to service the processing region 402. In one implementation, the top portion 422 may be fabricated from aluminum. The mask 440 is movably connected with the multidirectional movement device 424 through a mask shaft 441. Multidirectional movement devices 424 are devices, such as an electrical motor based system, which can be used to adjust the position of a mask connected with a mask shaft 441. The multidirectional movement device 424 allows for change in positioning along all three axes, such that the mask 440 can be precisely aligned with the substrate 404. In one implementation, the multidirectional movement device 424 includes a mechanical fixture in connection with an electric motor. The electric motor moves the mask shaft 441 in a first direction. The electric motor through a second fixture, such as a stainless steel ring, then moves the mask shaft 441 in a second direction and a third direction. Thus, by pivoting the mask shaft 441 while moving the mask shaft 441 up and down, the mask 440 can be repositioned along all three axes. In another implementation, the mask 440 can pivot on the mask shaft 441, thus allowing for changes in orientation of the mask 440. The movement of the multidirectional movement device 424 can be controlled to 1 mil resolution. Further, the multidirectional movement device 424 can level the mask 440 to the substrate support 430 without breaking vacuum.

Without intending to be bound by theory, the substrate mask concentricity is believed to beneficial from the perspective of etch profile and etch uniformity. Using mechanical concentricity and/or process concentricity, the multidirectional movement device 424 can correctly position the substrate with relation to the mask Mechanical concentricity can be determined by measuring the gap between the edge of the mask 440 and a portion of the substrate 404, such as the edge of the substrate 404. In another implementation, the edge of the mask 440 can be replaced with a feature formed on the mask 440. The position of the mask 440 and the substrate 404 can be determined using an optical device, such as a camera (not shown).

The manifold 408 has a plurality of slits formed therein. The slits described here are substantially similar to the slits 336, described with reference to FIG. 3. The manifold 408 is positioned around and fluidly sealed with upper opening 420, the upper opening 420 being connected with the top portion 422. A plasma shaft 426 passes through the manifold 408 and is fluidly connected with the region between the manifold 408 and the upper opening 420. The plasma shaft 426 is connected with a remote plasma source 428. The plasma shaft can be made from a metal used in processing chambers, such as aluminum. A quartz liner can be used inside the plasma shaft 426 to reduce recombination of the Oxygen radicals.

An inclined top wall liner 436 is formed around the upper opening 420. The inclined top wall liner 436 acts in conjunction with a sidewall liner (not shown) to prevent any parasitic leak of radicals. The exposed surface of the inclined top wall liner 436 is sloped to direct the radical flow to the edge of the substrate 404.

Without intending to be bound by theory, the etch rate is believed to be a function of oxygen radical concentration at the substrate 404 edge. The oxygen radical concentration uniformity is controlled by RPS gas flow uniformity through the manifold 408 and purge gas uniformity through the mask 440. The plasma shaft 426 is located off-center of the manifold 408. In the absence of modulation, this asymmetry can result in non-uniform radical distribution at the wafer edge. The manifold 408 is used to modulate the flow path and ensure uniform radical distribution at the wafer edge. This modulation is achieved by controlling the flow path and the conductance across different slots.

To etch a portion of a deposition film at an edge region of one substrate 404, the processing region 402 includes the remote plasma source 428 that is disposed adjacent to the top portion 422. The remote plasma source 428 includes a power source and one or more gas sources 438, such that plasma regions can be generated remotely. The manifold 408 is connected with the remote plasma source 428 through the plasma shaft 426, as described above.

The mask 440 may be composed of quartz, aluminum or another material which is capable of withstanding the etching gases. The mask 440 has a mask shaft 441, a masking plate 443, an angled ledge 444, and a flow surface 446. The mask shaft 441 extends from the masking plate 443 and connects the masking plate 443 with the multidirectional movement device 424. The mask shaft 441 may be part of a unitary body with the masking plate 443. The masking plate 443 has gas ports 442 formed therein. The gas ports 442 are shown as a plurality of ports positioned along the lower surface of the mask 440, however the gas ports may be a single gas port 442. Though the gas ports 442 are shown as interconnected to a single gas source 434, the gas ports 442 may be independent on one another and/or may be connected to separate gas sources. Further, the gas ports 442 may be positioned at any location which allows gas to be delivered through the masking plate 443 and toward the substrate position on the substrate support 430.

The angled ledge 444 extends outward from the masking plate 443. The angle of the angled ledge 444 determines the amount of space in the region between the substrate 404 and the masking plate 443. The angled ledge 444 can be substantially similar to the angled ledge 344, described with reference to FIG. 3. The mask 440 has a gas distribution circuit 432 formed or positioned therein. The gas distribution circuit 432 extends into the mask shaft 441. The gas distribution circuit 432 is connected with a gas source 434, such as inert gas source. The gas from the gas source 434 then flows through the gas distribution circuit 432 and then through the gas ports 442.

The bevel edge etching may be used to remove undesirable portions of a deposition film in the edge region of the substrate 404. When edge etching, the remote plasma source 428 receives an etching gas from the first gas source 438. Examples of etching gases may include, without limitation, $NF_3$, $O_2$, $F_2$, $N_2$, $H_2O$, $Cl_2$, $NH_3$, $H_2$, or $SF_6$. RF power can then be applied to an electrode in the remote plasma source 428 to excite the etching gas. An etching agent in a plasma phase is formed in the remote plasma source 428. The etching agent is then delivered through the plasma shaft 426 and to the manifold 408.

To prevent the diffusion of the etching agent toward the central region of the substrate 404, the second gas source 434 provides an inert gas that is delivered via the gas distribution circuit 432, and creates a high velocity flow on the top surface of the substrate 404 from its central region toward the flow surface 446 of the mask 440. The flow of the inert gas limits the action area of the etching agent to areas of the substrate 404 which are beyond the flow surface 446. While one specific implementation of the bevel etch loadlock bevel etch chamber 400 has been illustrated above, variant implementations may be possible.

Figure 4B:
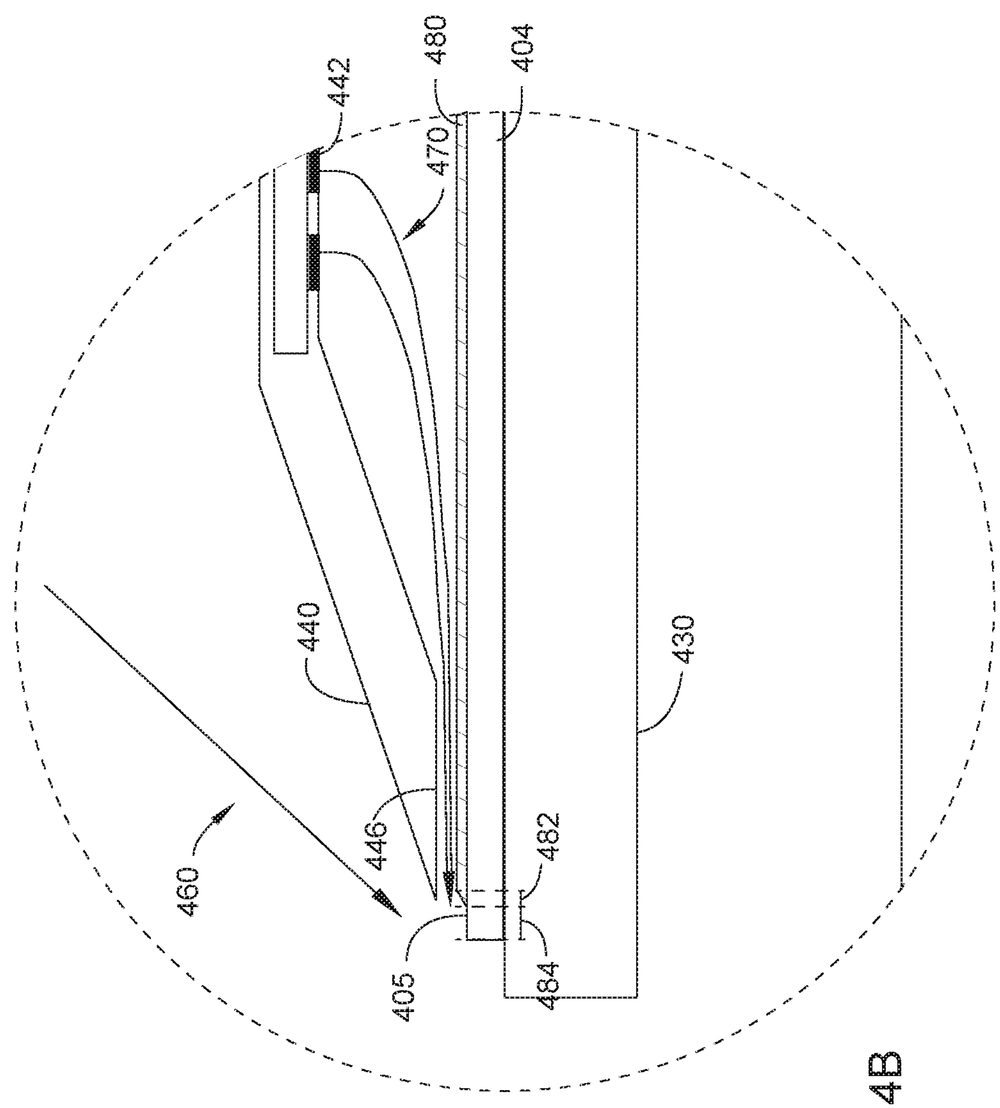
FIG. 4B depicts a close up view of a substrate during a loadlock bevel etching operation, according to implementations described herein.

FIG. 4B depicts a close up view of a substrate 404 during a loadlock bevel etching operation, according to implementations described herein. Shown here, the mask 440 is in position over the substrate 404. The substrate 404 has a layer 480 formed over the surface. An inert gas 470 is delivered through the mask 440 and to the layer 480. The inert gas 470 flows radially out from under the mask 440 creating a flow between the flow surface 446 and the layer 480 on the substrate 404.

The substrate mask gap can be maintained to control gas flow under the flow surface 446. Etch rate and uniformity have been shown to be sensitive to the substrate mask gap. The substrate mask gap is defined as the distance in inches between the flow surface and the exposed surface of the substrate 404. The substrate mask gap determines the purge velocity and also the O-radical concentration delivered to the bevel 405. The substrate mask gap also affects the angle of the radical flow, distance of the radicals from the wafer surface, and the degree of diffusion into the wafer interior. In one implementation, the substrate mask gap can be between 0.001 inches to 0.03 inches based on the mask dimension.

Simultaneously, an activated gas 460 is formed at the remote plasma source 438. The activated gas 460 can comprise both etching gases and inert gases, such as a activated gas 460 formed of Oxygen, Argon, and Nitrogen. The activated gas 460 then generates species that flow through the plasma shaft 426. In the implementation described above oxygen is an etch gas and argon acts as the carrier. The oxygen flow can range from about 2000 sccm and about 20000 sccm. The argon flow is optimized with respect to the system pressure. Argon flow rate can vary between about 2000 sccm and about 30000 sccm. Addition of Nitrogen can improve the etch rate. Nitrogen gas can be delivered at a flow rate of between about 100 sccm and about 1000 sccm, such as 200 sccm.

During operation, the substrate temperature can be maintained at a high temperature, such as a temperature higher than 250 degrees Celsius, for example higher than 350 degrees Celsius. In some implementations, the heater temperature is between about 300 degrees Celsius and about 650 degrees Celsius. The pressure of the loadlock bevel etch chamber 400 can be maintained at less than 1 atm. In one implementation, the pressure of the loadlock bevel etch chamber 400 is maintained at between 1 torr and 10 torr. By creating a high temperature and a low pressure, the bevel etch rate can be increased.

The remote plasma forms one or more species (hereinafter described as an activated gas 460) that are delivered to the processing region through the manifold 408, where the species from the activated gas 460 etches the layer 480. As the inert gas 470 flows under the flow surface 446, the velocity of the inert gas is increased proportionally to the decrease in volume. This increased velocity prevents underflow of the activated gas 460, such that the surface of the layer 480 under the flow surface 446 is not significantly etched. As the inert gas exits from under the flow surface 446, velocity is lost and the inert gas 470 diffuses into the activated gas 460. Thus, the bevel region 482, which is about 0.5 mm wide in this implementation, is etched at an angle related to the decreased efficiency of the inert gas 470 to deflect the activated gas 460. Bevel region 484, which is about 1.0 mm wide in this implementation, is not protected by the inert gas 470 and is completely etched by the activated gas 460. The gas flow from both the inert gas 470 and the activated gas 460 can be controlled to enable customized bevel thickness profiles to meet different customer specifications. In one implementation, the system is designed to clear the bevel up to 0.5 mm and reach ±5% of the full thickness at 1.5 mm.

Bevel etching is critical to transition to a no shadow ring configuration in the deposition chamber and meet the yield and uniformity requirements at smaller process nodes in the future. Traditionally, bevel etch systems are either standalone or utilize deposition chamber space. This negatively affects fab footprint and throughput per PECVD system. The bevel etch loadlock bevel etch chamber described herein achieves uniform bevel profile all around the circumference, customer specified edge exclusion, and the bevel etch chamber throughput exceeds the combined throughput of all the deposition chambers.

The bevel etcher described in this document uses a Remote Plasma Source (RPS) to produce oxygen-argon plasma to etch the bevel region of the substrate uniformly along the circumference of the substrate. The etch gas is a mixture of Oxygen, Argon, and Nitrogen that is uniformly distributed using distribution apparatus, such as a baffle or a manifold. A secondary Argon gas flow is used as the purge gas to control the etch profile and prevent radial diffusion of the etch reactants under the mask. The purge gas flows through a narrow gap between the wafer and the mask. The gas flow can be controlled to enable customized bevel thickness profiles to meet different customer specifications. The system is designed to clear the bevel up to 0.5 mm and reach ±5% of the full thickness at 1.5 mm. These specifications can change due to film and process variations but the system is capable of adapting the process condition to meet a wide range of profile requirements.

While the foregoing is directed to implementations of the disclosed devices, methods and systems, other and further implementations of the disclosed devices, methods and systems may be devised without departing from the basic scope thereof, and the scope thereof is determined by the claims that follow.

What is claimed is:

1. A chamber, comprising:
- a substrate support having a substrate support surface positioned in a processing region;
- a masking assembly coupled to a gas source, the masking assembly comprising:
  - a masking plate;
  - an extension connected with the masking plate;
  - a baffle connected with the extension, the baffle including a standoff portion positioned to contact the substrate support, and wherein, when the substrate support is disposed against the standoff portion, a uniform gap defined by parallel surfaces is formed between a portion of the mask assembly and the peripheral region of the substrate support;
  - a movement control device in connection with the baffle, the movement control device positioned to move the baffle and the mask simultaneously; and
  - a gas channel formed in the masking plate, the gas channel and the masking plate being positioned to deliver a gas flow over the substrate support surface, the gas flowing radially outward from a central region of the substrate support surface toward the peripheral region of the substrate support surface; and
- a remote plasma source positioned to supply an etching agent to a peripheral region of the substrate support surface, the remote plasma source configured to produce an activated gas and deliver the activated gas to the processing region through the baffle.

2. The chamber of claim 1, wherein the masking plate comprises a central port formed therein.

3. The chamber of claim 1, wherein the masking assembly further comprises an angled ledge extending from the masking plate.

4. The chamber of claim 3, wherein the angled ledge forms an angle of between 15 and 45 degrees as measured from a surface of the masking plate.

5. The chamber of claim 1, wherein the masking plate comprises a plurality of ports formed therein.

6. The chamber of claim 1, wherein the standoff portion extends from a periphery of the baffle.

7. The chamber of claim 1, further comprising a chuck ring positioned to receive the standoff portion.

8. A chamber, comprising:
- a substrate support having a substrate support surface positioned in a processing region;
- a remote plasma source configured to supply an etching agent to a peripheral region of the substrate support surface; and
- a masking assembly coupled to a gas source, the masking assembly comprising:
  - a masking plate;
  - a mask shaft connected with the masking plate;
  - a baffle connected with the mask shaft, the baffle including a standoff portion positioned to contact the substrate support, and wherein, when the substrate support is disposed against the standoff portion, a uniform gap defined by parallel surfaces is formed between a portion of the mask assembly and the peripheral region of the substrate support;
  - a multidirectional movement device in connection with the mask shaft, the multidirectional movement device being able to adjust the position of mask by moving the mask shaft; and
  - a gas channel formed in the masking plate, the gas channel and the masking plate positioned to deliver a gas flow over the substrate support surface, the gas flowing from an approximately central region of the substrate support surface toward the peripheral region of the substrate support surface.

9. The chamber of claim 8, wherein the masking assembly further comprises an angled ledge extending from the masking plate.

10. The chamber of claim 9, wherein the angled ledge forms an angle of between 15 and 45 degrees as measured from a surface of the masking plate.

11. The chamber of claim 8, wherein the standoff portion extends from a periphery of the baffle.

12. A chamber, comprising:
- a substrate support having a substrate support surface positioned in a processing region;
- a remote plasma source positioned and operable to supply an etching agent through a baffle to a peripheral region of the substrate support surface, wherein the baffle includes a standoff portion positioned to contact the substrate support;
- a masking assembly coupled to a gas source, wherein the masking assembly is positioned to deliver a gas flow over the substrate support surface, and wherein, when the substrate support is disposed against the standoff portion, and uniform gap defined by parallel surfaces is formed between a portion of the mask assembly and the peripheral region of the substrate support; and
- a movement control device operable to move the masking assembly.

13. The chamber of claim 12, wherein the masking assembly comprises a masking plate with a central port formed therein.

14. The chamber of claim 13, wherein the masking assembly further comprises an angled ledge extending from the masking plate.

15. The chamber of claim 14, wherein the angled ledge forms an angle of between 15 and 45 degrees as measured from a surface of the masking plate.

16. The chamber of claim 12, wherein the masking plate comprises a plurality of ports formed therein.

17. The chamber of claim 12, wherein species from the etching agent are delivered to the processing region through a plurality of slits through a lower portion of the baffle.

18. The chamber of claim 12, wherein the standoff portion extends from a periphery of the baffle.

19. The chamber of claim 18, further comprising a chuck ring in contact with the substrate support and positioned to receive the standoff portion.

20. The chamber of claim 12, wherein the masking assembly is coupled to a center portion of the baffle.

* * * * *